(12) United States Patent
Wan

(10) Patent No.: US 10,291,870 B2
(45) Date of Patent: May 14, 2019

(54) MONOLITHICALLY INTEGRATED RGB PIXEL ARRAY AND Z PIXEL ARRAY

(71) Applicant: Google LLC, Mountain View, CA (US)

(72) Inventor: Chung Chun Wan, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/718,478

(22) Filed: Sep. 28, 2017

(65) Prior Publication Data

US 2018/0020179 A1 Jan. 18, 2018

Related U.S. Application Data

(63) Continuation of application No. 14/579,866, filed on Dec. 22, 2014, now abandoned.

(51) Int. Cl.
*H04N 9/47* (2006.01)
*H04N 7/18* (2006.01)
(Continued)

(52) U.S. Cl.
CPC ......... *H04N 5/3765* (2013.01); *G01S 7/4813* (2013.01); *G01S 7/4816* (2013.01); *G01S 7/4863* (2013.01); *G01S 7/4914* (2013.01); *G01S 17/023* (2013.01); *G01S 17/08* (2013.01); *G01S 17/89* (2013.01); *H01L 27/14625* (2013.01); *H01L 27/14627* (2013.01); *H01L 27/14645* (2013.01); *H01L 27/14649* (2013.01); *H01L 27/14685* (2013.01); *H04N 5/2258* (2013.01); *H04N 5/23245* (2013.01); *H04N 5/3415* (2013.01); *H04N 9/045* (2013.01);
(Continued)

(58) Field of Classification Search
CPC .. H04N 5/3765; H04N 5/3415; H04N 13/025; H04N 9/045; H04N 5/23245; H04N 5/2258; G01S 17/023; G01S 17/08; G01S 7/4914; G01S 7/4863; G01S 7/4816; G01S 7/4813; G01S 17/89; H01L 27/14649; H01L 27/14645; H01L 27/14627; H01L 27/14625; H01L 27/14685; H01L 27/14634; H01L 27/14618
USPC ........................................................ 348/135
See application file for complete search history.

(56) References Cited

U.S. PATENT DOCUMENTS 7,274,393 B2 9/2007 Acharya
7,375,803 B1 5/2008 Bamji
(Continued)

FOREIGN PATENT DOCUMENTS

CN 102438111 A 5/2012
CN 102685402 A 9/2012
(Continued)

OTHER PUBLICATIONS

Extended European Search Report issued in European Application No. 15873894.8, dated May 8, 2018, 9 pages.
(Continued)

*Primary Examiner* — Jared Walker
(74) *Attorney, Agent, or Firm* — Fish & Richardson P.C.

(57) ABSTRACT

An apparatus is described that includes first and second pixels arrays integrated on a same semiconductor chip. The first pixel array contains visible light pixels and no Z pixels. The second pixel array contains Z pixels and no visible light pixels. The first and second pixel arrays do not overlap on said same semiconductor chip.

20 Claims, 13 Drawing Sheets

(51) Int. Cl.

| | |
|---|---|
| *H04N 5/376* | (2011.01) |
| *H04N 5/225* | (2006.01) |
| *H04N 5/232* | (2006.01) |
| *H01L 27/146* | (2006.01) |
| *H04N 9/04* | (2006.01) |
| *G01S 17/02* | (2006.01) |
| *G01S 17/08* | (2006.01) |
| *G01S 17/89* | (2006.01) |
| *G01S 7/481* | (2006.01) |
| *G01S 7/486* | (2006.01) |
| *G01S 7/491* | (2006.01) |
| *H04N 5/341* | (2011.01) |
| *H04N 13/02* | (2006.01) |

(52) U.S. Cl.
CPC ..... *H04N 13/025* (2013.01); *H01L 27/14618* (2013.01); *H01L 27/14634* (2013.01)

(56) References Cited

U.S. PATENT DOCUMENTS

| | | | |
|---|---|---|---|
| 7,936,038 | B2 | 5/2011 | Jeong et al. |
| 7,990,636 | B2 | 8/2011 | Park et al. |
| 8,027,107 | B2 | 9/2011 | Hwang et al. |
| 8,116,018 | B2 | 2/2012 | Park et al. |
| 8,139,141 | B2 | 3/2012 | Bamji et al. |
| 8,139,142 | B2 | 3/2012 | Bamii et al. |
| 8,159,762 | B2 | 4/2012 | Lim et al. |
| 8,218,016 | B2 | 7/2012 | Park et al. |
| 8,542,348 | B2 | 9/2013 | Hardegger et al. |
| 9,214,492 | B2 | 12/2015 | Van Der Tempel et al. |
| 2003/0063185 | A1 | 4/2003 | Bell |
| 2006/0221250 | A1* | 10/2006 | Rossbach ............... G01S 17/89 348/630 |
| 2008/0032438 | A1 | 2/2008 | Wen et al. |
| 2010/0020209 | A1 | 1/2010 | Kim |
| 2010/0102206 | A1* | 4/2010 | Cazaux ............ H01L 27/14603 250/208.1 |
| 2011/0108708 | A1* | 5/2011 | Olsen ................... H04N 13/214 250/208.1 |
| 2011/0194007 | A1 | 8/2011 | Kim et al. |
| 2012/0056073 | A1 | 3/2012 | Ahn |
| 2012/0249744 | A1 | 10/2012 | Pesach et al. |
| 2013/0026859 | A1 | 1/2013 | Bae et al. |
| 2013/0120623 | A1 | 5/2013 | Kim |
| 2013/0123015 | A1 | 5/2013 | Jung et al. |
| 2013/0134470 | A1 | 5/2013 | Shin et al. |
| 2013/0134541 | A1* | 5/2013 | Chang ................ H01L 27/1462 257/435 |
| 2014/0071241 | A1 | 3/2014 | Yang |
| 2014/0138519 | A1* | 5/2014 | Wang ..................... G01S 17/89 250/206.1 |
| 2014/0176663 | A1 | 6/2014 | Cutler et al. |
| 2014/0217474 | A1 | 8/2014 | Lee et al. |
| 2014/0347442 | A1 | 11/2014 | Wang et al. |
| 2015/0022869 | A1 | 1/2015 | Shi et al. |
| 2015/0069218 | A1 | 3/2015 | Cho |
| 2015/0281601 | A1 | 10/2015 | Ganapathi |

FOREIGN PATENT DOCUMENTS

| | | |
|---|---|---|
| CN | 103369339 A | 10/2013 |
| CN | 103839952 A | 6/2014 |
| EP | 2451150 | 5/2012 |
| EP | 2747139 | 6/2014 |
| JP | 2009-093050 | 4/2009 |
| WO | WO 2009/046268 | 4/2009 |

OTHER PUBLICATIONS

'tech.nikkeibp.co.jp' [online] "[ISSCC] Samsung's CMOS Sensor Takes Range, RBG Images at Same Time," Tomonori Shindo, Nikkei Electronics, Feb. 25, 2012, Retrieved from Internet: URL<http://tech.nikkeibp.co.jp/dm/english/NEWS_EN/20120225/206010/> 2 pages.

'techcrunch.com' [online] "New Samsung Sensor Captures Both Light and Depth Data," Devin Coldwey, Mar. 1, 2012, Retrieved from Internet: URL< https://techcrunch.com/2012/02/29/new-samsung-sensor-captures-both-light-and-depth-data/> 2 pages.

'www.123anfang.com' [online] "Starlight Video Surveillance Camera Dedicated Sony ISX017 Integrated Image Sensor," Guardian Security, Aug. 5, 2016, Retrieved from Internet: URL<www.123AnFang.com> 5 pages.

'www.embedded-vision.com' [online] "Time of Flight: Samsung's New RGB Image Sensor Also has Depth Sight," Mar. 1, 2012, Retrieved from Internet: URL< https://www.embedded-vision.com/news/2012/03/01/time-flight-samsungs-new-rgb-image-sensor-also-has-depth-sight> 2 pages.

'www.petapixel.com' [online] Sony Shows Off a New Ultra-Sensitive CMOS Sensor Called 'STARVIS' Michael Zhang, Oct. 26, 2015, [retrieved on Mar. 28, 2018] Retrieved from Internet: URL<https://petapixel.com/2015/10/26/sony-shows-off-a-new-ultra-sensitive-cmos-sensor-called-starvis/> 14 pages.

'www.ptgrey.com' [online] "Exmor R / STARVIS," Available on or before Jul. 13, 2017 via the Wayback Internet Archive [retrieved on Mar. 28, 2018] Retrieved from Internet: URL< https://www.ptgrey.com/exmor-r-starvis> 5 pages.

'www.sunnic.com' [online] "Sony Develops RGB+IR Image Sensor Solution," Oct. 12, 2016, [retrieved on Apr. 4, 2018] Retrieved from Internet: URL<http://www.sunnic.com.tw/english/05_news/02_detail.php?NID=119> 2 pages.

Kim et al. "A 1.5Mpixel RGBZ CMOS Image Sensor for Simultaneous Color and Range Image Capture," IEEE International Solid-State Circcuits Conference, Session 22.7, 978-1-4673-00377-4, Feb. 2012, 3 pages.

Sony Brochure "CMOS Image Sensor," 2015 New Products, 5 pages.

Sony. "Preliminary ISX017-0AWR-C: STARVIS," Revision 0.2, Retrieved from Internet: URL<http://www.google.com/url?sa=t&rct=j&q=&esrc=s&source=web&cd=1&ved=oahUKEwjvrqjFpdPaAhVSZKwKHccGDBIQFggpMAA&url=http%3A%2F%o2Fe2e.ti.com%2Fcfs-file%2F_key%2Fcommunityserver-discussions-components-files%2F26%2FISX017_2D00_0AWR_2D00_C_5F00_E_5F00_TechnicalDatasheet_5F00Rev0-2.pdf&usg=AOvVaw1W_J4Zbiskzwyt-1NYLtp5 > 84 pages.

Enquist, Paul, "Direct Bond Interconnect Slashes Large-Die SOC Manufacturing Costs", FSA Forum, Fall 2006, 3 pages.

Baron, Jerome, "Backside Illumination, Wafer-Scale Opticws Drive 2X-5X Jump in CMOS Image Sensor Performance", Solid State Technology, http://electroig.com/blog/2010/05/back-side-illurnination, May 24, 2010, pp. 1-6.

Holly, Russell, "Pelican Imaging and Why 16 Tiny Cameras Are Better Than One Big One", GeeK, Sep. 24, 2013, http://www.qeek.com/mobile/pelican-mobile-camera-array-hopes-to reinvent-the-smartphone-camera-156956/, pp. 1-4.

PCT/US2015/056912—International Search Report and Written Opinion, dated Jan. 28, 2016, 12 pages.

EP Office Action issued in European Application No. 15783894.8, dated Dec. 20, 2018, 4 pages.

CN Office Action issued in Chinese Application No. 201580035530.2, dated Jan. 14, 2019, 13 pages (English translation).

* cited by examiner

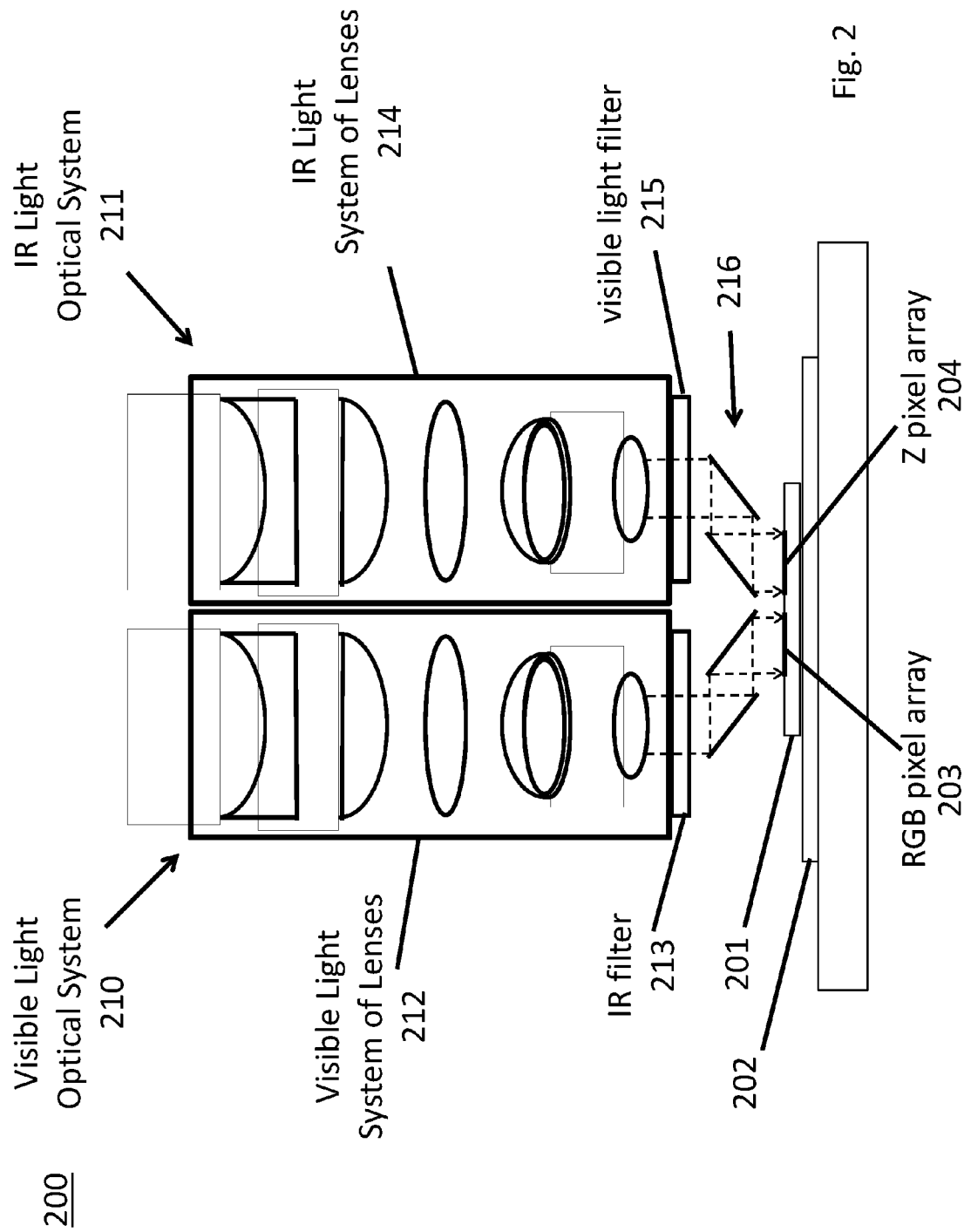

MONOLITHICALLY INTEGRATED RGB PIXEL ARRAY AND Z PIXEL ARRAY

CROSS REFERENCE TO RELATED APPLICATION

This application is a continuation of U.S. application Ser. No. 14/579,866, filed Dec. 22, 2014, the contents of which are incorporated by reference herein.

FIELD OF THE INVENTION

The field of invention pertains generally to the electronic arts, and, more specifically, to a monolithically integrated RGB pixel array and Z pixel array.

BACKGROUND

Many existing computing systems include one or more traditional image capturing cameras as an integrated peripheral device. A current trend is to enhance computing system imaging capability by integrating depth capturing into its imaging components. Depth capturing may be used, for example, to perform various intelligent object recognition functions such as facial recognition (e.g., for secure system un-lock) or hand gesture recognition (e.g., for touchless user interface functions).

One depth information capturing approach, referred to as "time-of-flight" imaging, emits light from a system onto an object and measures, for each of multiple pixels of an image sensor, the time between the emission of the light and the reception of its reflected image upon the sensor. The image produced by the time of flight pixels corresponds to a three-dimensional profile of the object as characterized by a unique depth measurement (z) at each of the different (x,y) pixel locations.

As many computing systems with imaging capability are mobile in nature (e.g., laptop computers, tablet computers, smartphones, etc.), the integration of time-of-flight operation along with traditional image capture presents a number of design challenges such as cost challenges and packaging challenges.

SUMMARY

An apparatus is described that includes first and second pixels arrays integrated on a same semiconductor chip. The first pixel array contains visible light pixels and no Z pixels. The second pixel array contains Z pixels and no visible light pixels. The first and second pixel arrays do not overlap on said same semiconductor chip.

An apparatus is described that includes means for receiving substantially only visible light within a first region of a semiconductor chip's surface area. The apparatus also includes means for receiving substantially only infrared light within a first region of a semiconductor chip's surface area, where, the first and second regions are not intermixed. The apparatus also includes means for pixelating the visible light into multiple colors within a first multilayer structure of the semiconductor chip within the first region The apparatus also includes means for pixelating the infrared light within a second multilayer structure of the semiconductor chip within the second region The apparatus also includes means for generating first electronic signals that are representative of the pixelated visible light with the semiconductor chip's substrate within the first region The apparatus also includes means for generating second electronic signals that are representative of the pixelated infrared light with the semiconductor chip's substrate within the second region.

FIGURES

The following description and accompanying drawings are used to illustrate embodiments of the invention. In the drawings:

FIG. 2 shows a camera that includes a monolithic RGBZ pixel array;

DETAILED DESCRIPTION

An "RGBZ" image sensor is an appealing solution for achieving both traditional image capture and time of flight depth profiling from within a same camera package. An RGBZ image sensor is an image sensor that includes different kinds of pixels, some of which are sensitive to visible light (e.g., RGB pixels) and others of which are used to measure depth information (the time-of-flight or "Z" pixels).

In a common implementation, time of flight pixels are designed to be sensitive to IR light because, as mentioned above, IR light is used for the time-of-flight measurement so that the time-of-flight measurement does not interfere with the traditional imaging functions of the RGB pixels. The time-of-flight pixels additionally have special associated clocking and/or timing circuitry to measure the time at which light has been received at the pixel. Because the time-of-flight pixels are sensitive to IR light, however, they may also be conceivably used (e.g., in a second mode) as just IR pixels and not time-of-flight pixels (i.e., IR information is captured but a time of flight measurement is not made).

Figure 1A:
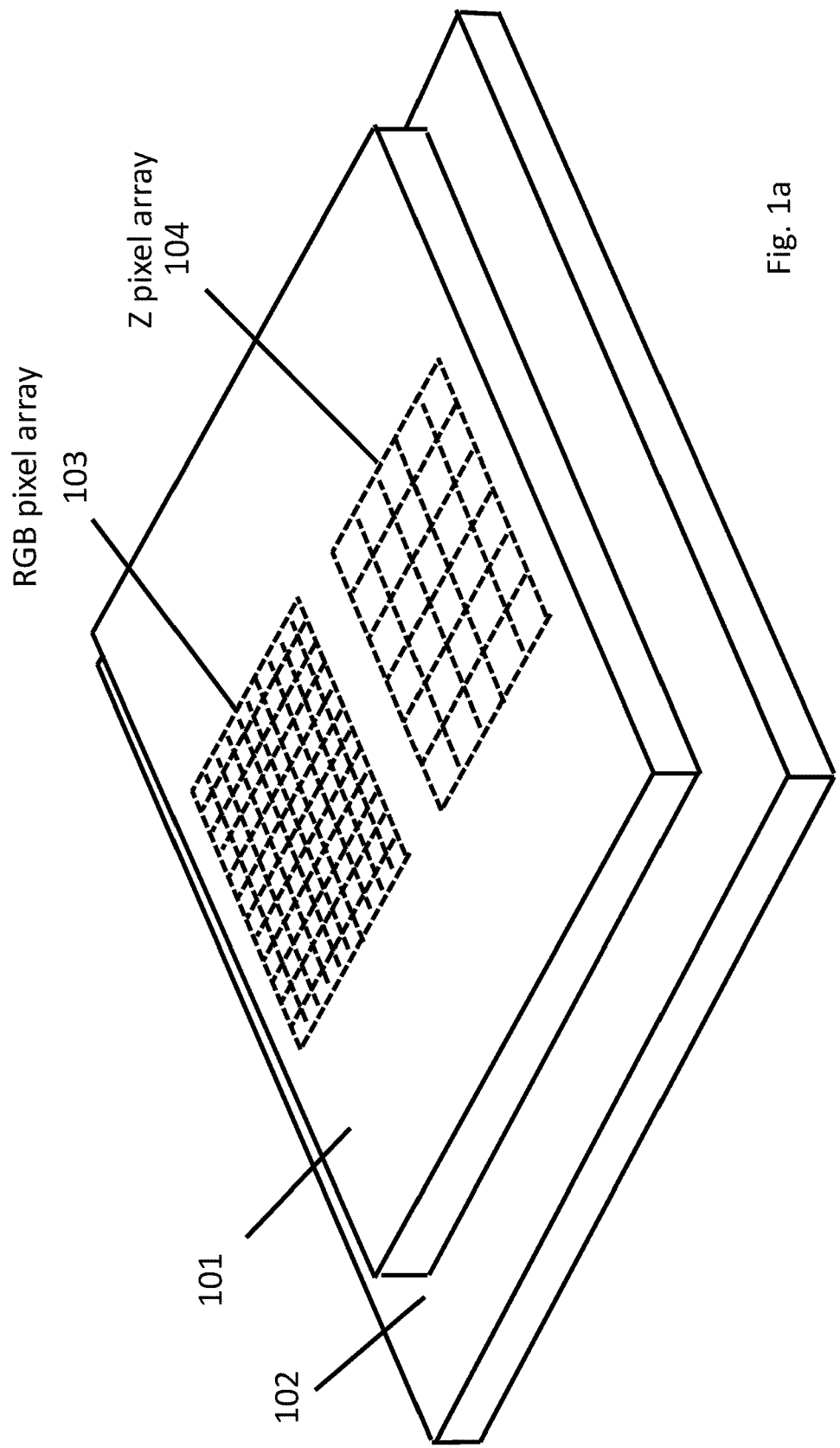
FIGS. 1a and 1b show different perspectives of a monolithic RGBZ pixel array.
Figure 1B:
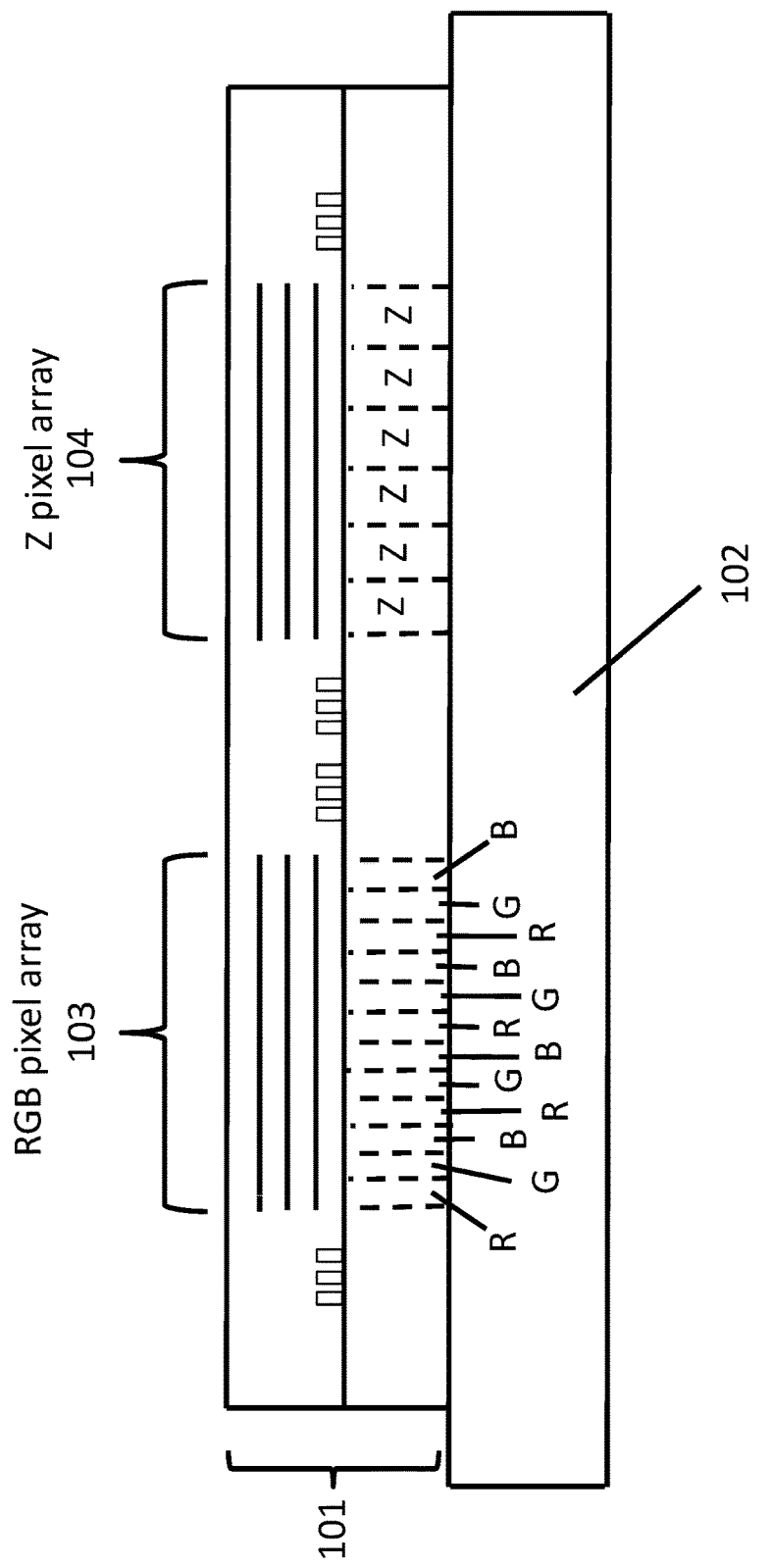

Integrating both RGB pixels and Z pixels into a same package should reduce both size and cost as compared to solutions in which the RGB pixels and Z pixels are contained in separate packages. FIGS. 1a and 1b show a monolithic RGBZ pixel array in which one whole region of the surface area of a semiconductor chip 101 is reserved for RGB pixels 103 and another whole region of the surface area of the semiconductor chip 101 is reserved for Z pixels 104.

The RGB pixel array region 103 includes a pixel array having different kinds of pixels that are sensitive to visible light (specifically, a subset of R pixels that are sensitive to visible red light, a subset of G pixels that are sensitive to visible green light and a subset of B pixels that are sensitive to blue light). The Z pixel array region 104 has pixels that are sensitive to IR light. The RGB pixels are used to support traditional "2D" visible image capture (traditional picture taking) functions. The IR sensitive pixels are used to support 3D depth profile imaging using time-of-flight techniques. Although a basic embodiment includes RGB pixels for the visible image capture, other embodiments may use different colored pixel schemes (e.g., Cyan, Magenta and Yellow). For simplicity the remainder of the present application will refer mainly to RGB pixel schemes even though other colored schemes may be used.

As observed in FIGS. 1a and 1b, in an embodiment, the Z pixels are made larger than the RGB pixels as a consequence of the IR light associated with time-of-flight measurements typically having weaker intensities than the visible light associated with traditional image capture. Here, the IR light is typically generated with one or more vertical cavity surface emitting lasers (VCSELs) or light emitting diodes (LEDs) integrated with the camera system that have a limited emitted intensity. As such, after reflection of the IR light from an object and its reception by the Z pixels, the IR light has less intensity than normal sunlight or a lighted room. By forming larger Z pixels, the Z pixels are able to capture a sufficient amount of IR light, despite its weaker intensity, to generate an appreciable signal.

FIG. 2 shows a cross section of an embodiment of a camera 200 that includes a monolithic RGBZ sensor as discussed above with respect to FIGS. 1a and 1b. As observed in FIG. 2 the camera 200 includes a visible light optical system 210 and an IR light optical system 211. The visible light optical system 210 includes a system of lenses 212 and an IR filter 213 that blocks IR light. The IR light optical system 211 includes a system of lenses 214 and a visible light filter 215 that blocks visible light. Incident light that is processed by the visible light optical system 210 is ultimately received by the RGB pixel array 203. Incident light that is processed by the IR light optical system 211 is ultimately received by the Z pixel array 204. The RGB and Z pixel arrays 203, 204 are integrated on the same semiconductor chip 201. The semiconductor chip 201 is mounted on a lower substrate 202 which may be, as described in more detail below, a package substrate or another semiconductor chip 202.

The visible light optical system 210 and the IR light optical system 211 may be separately/individually encased (e.g., with respective, surrounding housings) so that light received by one of the systems does not pass into the other system. The blocking of IR light in the visible light system 210 by the IR filter 213 substantially prevents the RGB pixels 203 from detecting/responding to IR light generated by the time-of-flight illuminator. Likewise, the blocking of visible light in the IR light system 211 by the visible light filter 215 substantially prevents the Z pixels 204 from detecting/responding to visible light. As such, both pixel arrays 203, 204 will substantially receive light associated with the specific image they are supposed to sense.

The lower portions of both optical system contain a system of mirrors 216 to bring the output image planes from both optical systems 210, 211 closer together. Here, with the RGB and Z pixel arrays 203, 204 being integrated on the surface of the same semiconductor chip 201 their relative separation can be made less than the dimensions of the lenses used in the pair of optical systems 210, 211. The design and operation of the multi-element system of lenses 212, 214 is generally known in the art and will not be discussed at length. Here, as is known in the art, each of the system of lenses 212, 214s is designed to capture incident light from fairly wide angles to provide the camera with a larger field of view and then process the incident light into an image plane with acceptably small optical distortion.

Figure 3A:
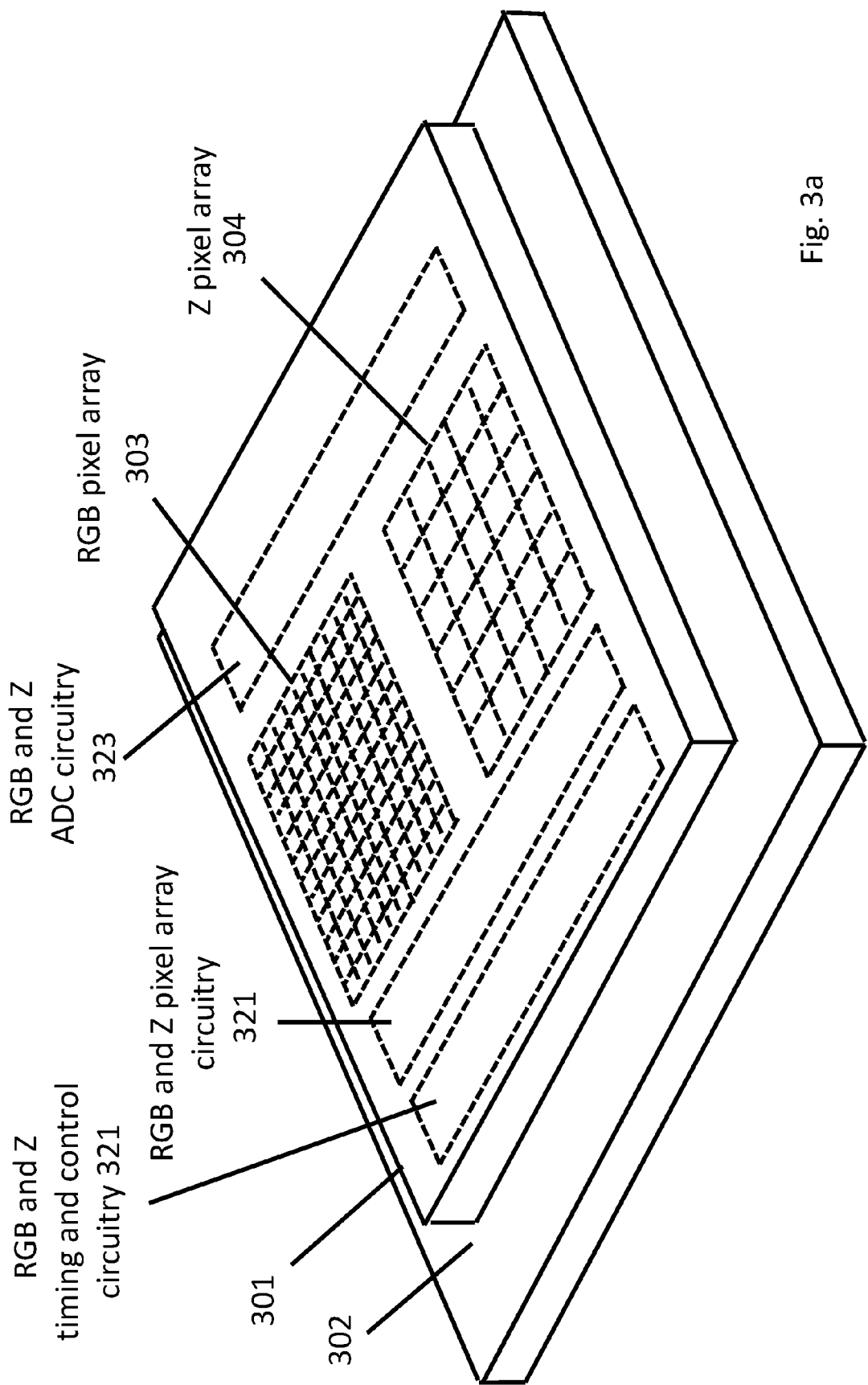
FIGS. 3a through 3c show different RGBZ pixel array embodiments.
Figure 3B:
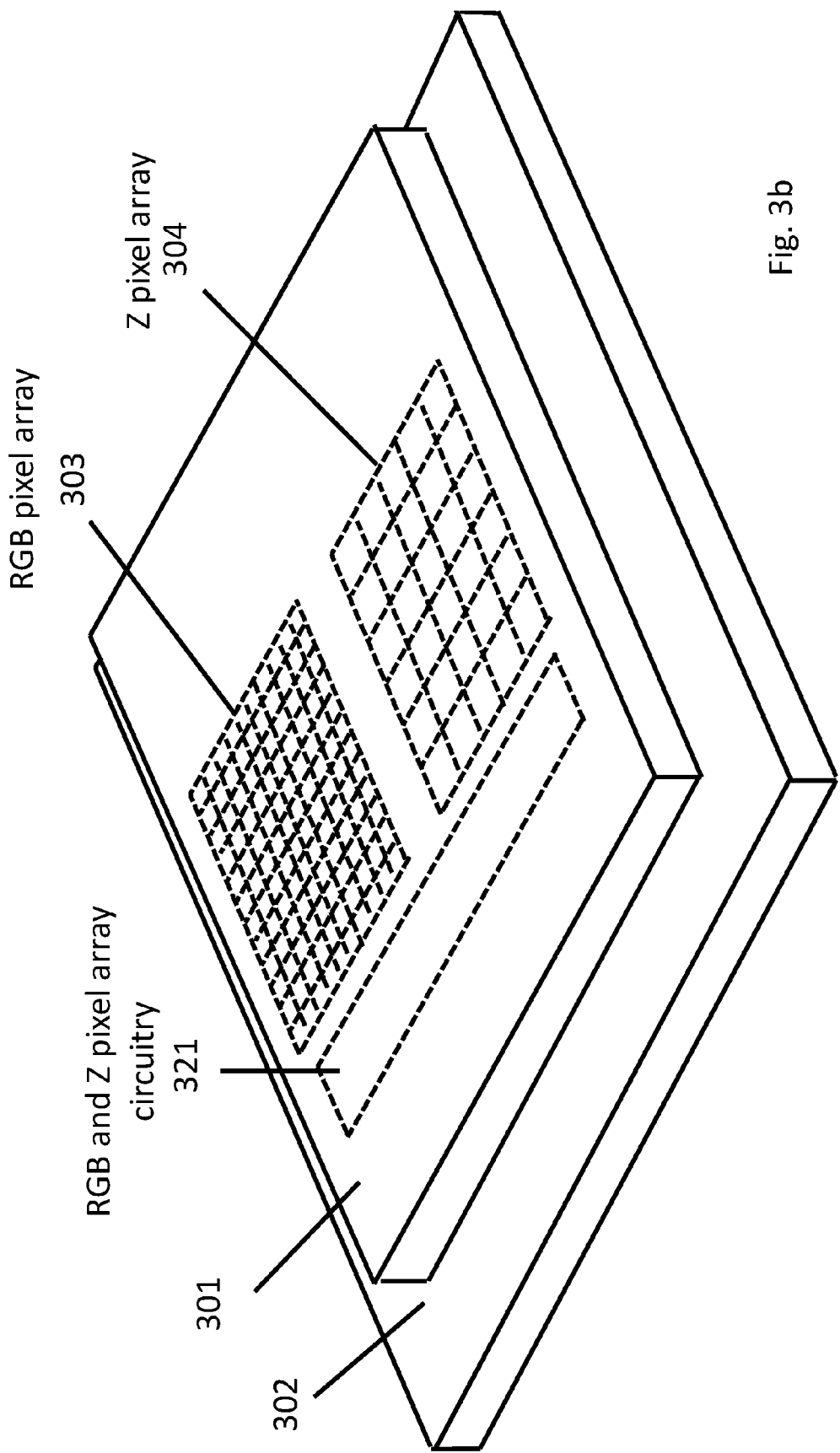
Figure 3C:
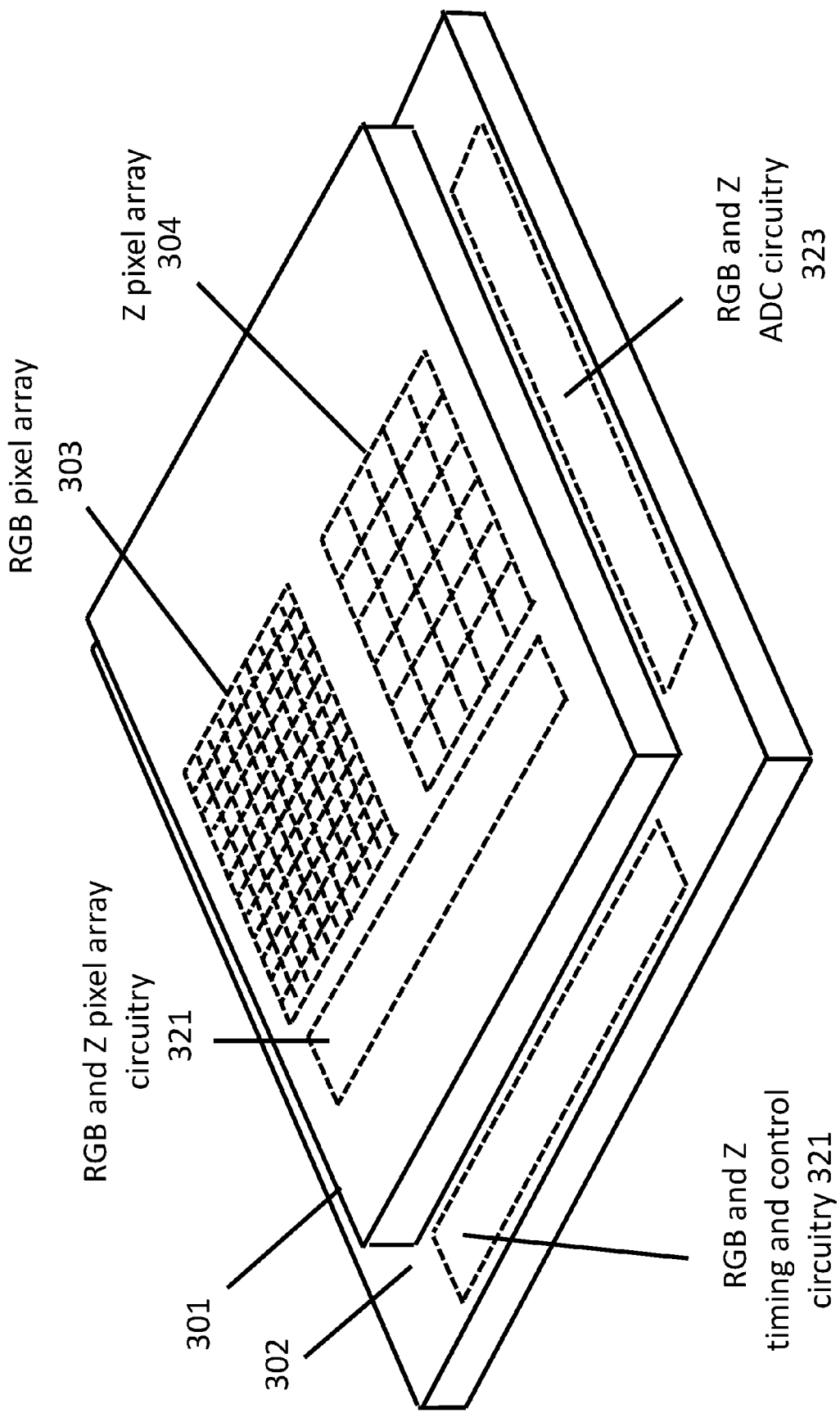

FIGS. 3a through 3c, depict various embodiments that integrate some or all components of a complete image sensor onto the same semiconductor die and/or within the same semiconductor chip package as the monolithically integrated RGB and Z pixel array. As is known in the art, a complete image sensor typically includes pixel array circuitry, analog-to-digital (ADC) circuitry and timing and control circuitry. Pixel array circuitry is directly coupled to a pixel array and serves as an electrical interface to the pixel array. Pixel array circuitry typically includes, e.g., row address decoders, column address decoders and sense amplifiers. ADC circuitry is responsible for converting the analog signals generated by the pixels into digital values.

Timing and control circuitry is responsible for generating the control signals and clocking signals used to operate a pixel array and ADC circuitry. Z pixels used for time of flight measurements typically receive clock signals from the timing and control circuitry that each have a known phase relationship with the illuminator's clock signal. In one embodiment, there are four such clock signals (e.g., 0°, 90°, 180° and 270° quadrature arms) provided to each Z pixel of the Z pixel array.

Here, regions of a Z pixel that are clocked by clocks of differing phase will collect different amounts of charge for a same light flash. Collected charge signals from differently clocked nodes in a same/proximate region of the sensor can be combined to generate a specific time-of-flight value for the region where the nodes reside. In one approach, such combination is made by the host system (e.g., processor or applications processor) with an image signal processor. Other implementations may include an image signal processor or various functions thereof on the same semiconductor chip as the image sensor. For simplicity the remainder of the discussion will assume the image signal processor is performed by a host.

FIGS. 3a through 3c show different packaging and/or architectural options for a monolithically integrated RGB pixel array and Z pixel array. As observed in FIG. 3a, a complete RGB image sensor and a complete Z sensor are integrated on a same semiconductor chip 301. That is, the semiconductor chip 301 not only includes an RGB pixel array 303 and a Z pixel array 304, but also includes respective pixel array circuitry 321, ADC circuitry 322 and timing and control circuitry 323 for each of the RGB and Z pixel arrays 303, 304. In this embodiment, the semiconductor chip 301 may be packaged in a semiconductor chip package and the input and/or output terminals (I/Os) of the semiconductor chip 301 may be routed directly to the I/Os of the package. As such, the lower substrate 302 of the semiconductor chip 301 may correspond to a semiconductor chip package substrate.

As observed in FIG. 3b, the semiconductor chip 301 includes the respective pixel array circuitry 321 for both the RGB and Z pixel arrays 303, 304 but not the ADC circuitry or the timing and control circuitry. Here, like the embodiment of FIG. 3a, the semiconductor chip 301 may be packaged alone and it's I/Os routed outside the package. In this case the lower substrate 302 corresponds to the package substrate and the packaged product is essentially a pair of pixel arrays 303, 304 with supporting pixel array circuitry 321.

By contrast, as observed in FIG. 3c, the lower substrate 302 may correspond to a second, lower semiconductor chip that the semiconductor chip 301 with the pixel arrays 303, 304 is stacked upon. The second, lower semiconductor chip 302 may then be mounted on a package substrate (not shown). Chip stacking may be accomplished, e.g., by forming through-substrate-vias within the upper pixel array semiconductor chip 301 that terminate on the chip's back side and make contact to lands on the upper surface of the lower semiconductor chip 302 through micro-bumps of solder residing in between. Alternatively, wire bond lands around the periphery of the upper pixel array die 301 may support wire bonds that make contact to opposite wire bond lands on the package substrate.

The lower semiconductor chip 302 may then include one or more of the remaining components of an image sensor. Specifically, the lower semiconductor chip 302 may include one or more of the ADC circuitry 322 and/or the timing and control circuitry 323 for either or both of the RGB and Z pixel arrays 303, 304. As such, the package that includes both semiconductor chips 301, 302 may include all or at least substantial portions of a complete image sensor for both pixel arrays 303, 304.

FIGS. 4a through 4d show a method of manufacturing an integrated RGB pixel array and Z pixel array. As observed in FIG. 4a, respective electronic interconnect features 430_1, 430_2 formed from a number of deposited and patterned metallization layers are disposed over the semiconductor chip substrate 431, where, the interconnect features are organized into sets 430_1, 430_2 specific to each pixel array (e.g., a first set of wiring 430_1 is for the RGB pixel array and a second set of wiring 430_2 is for the Z pixel array (even thought both sets 430_1, 430_2 may occupy say metallization layers)). In an embodiment, as observed in FIG. 4a, the Z pixels are larger than the RGB pixels. As such, the set of wiring 430_1 for the RGB pixels is apt to be more dense than the set of wiring 430_2 for the Z pixels.

Figure 4A:
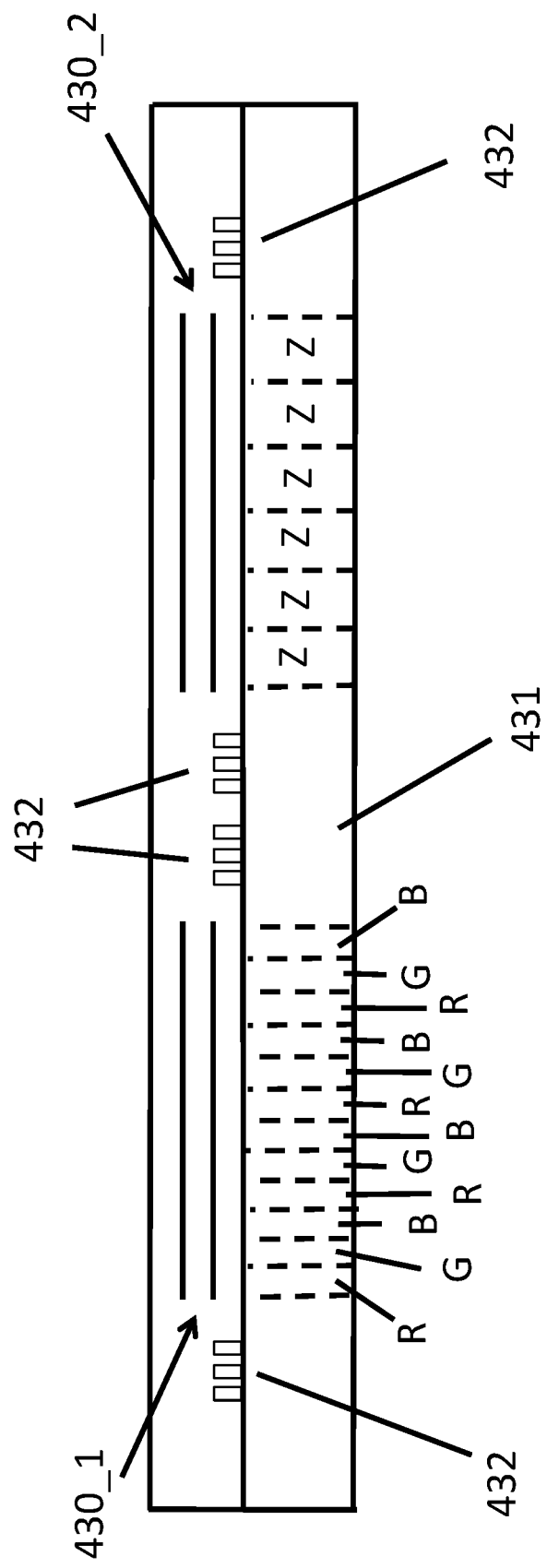
FIGS. 4a through 4d show a method for manufacturing a monolithic RGBZ pixel array.

The electronic interconnect features 430_1, 430_2 typically include, for each pixel, one or more contacts to the underlying silicon (e.g., to bias the pixel and/or pick-up the pixel's optically induced electrical signal) and wiring to/from the supporting pixel array circuits that, e.g., reside outside the periphery of the pixel array. Transistors 432 representing such circuitry are depicted in FIG. 4a. Note that although the embodiments of FIGS. 3a through 3c did not indicate that circuitry may reside in regions between the RGB and Z pixel arrays, FIG. 4a indicates that they may so reside (as observed by the presence of transistor between the two pixel arrays).

Contacts and wiring within the metallization layers are formed by alternating the deposition and patterning (e.g., via photo-resist layering and masked exposure) of dielectric and metal layers. Typically some form of insulating passivation layer (e.g., a thin layer of Silicon Dioxide (SiO2)) is also deposited on the upmost layer of the metallization part of the structure. Thus, at the completion of the interconnect metallization sequence, the wiring for both image sensors are integrated on the semiconductor substrate 431.

Figure 4B:
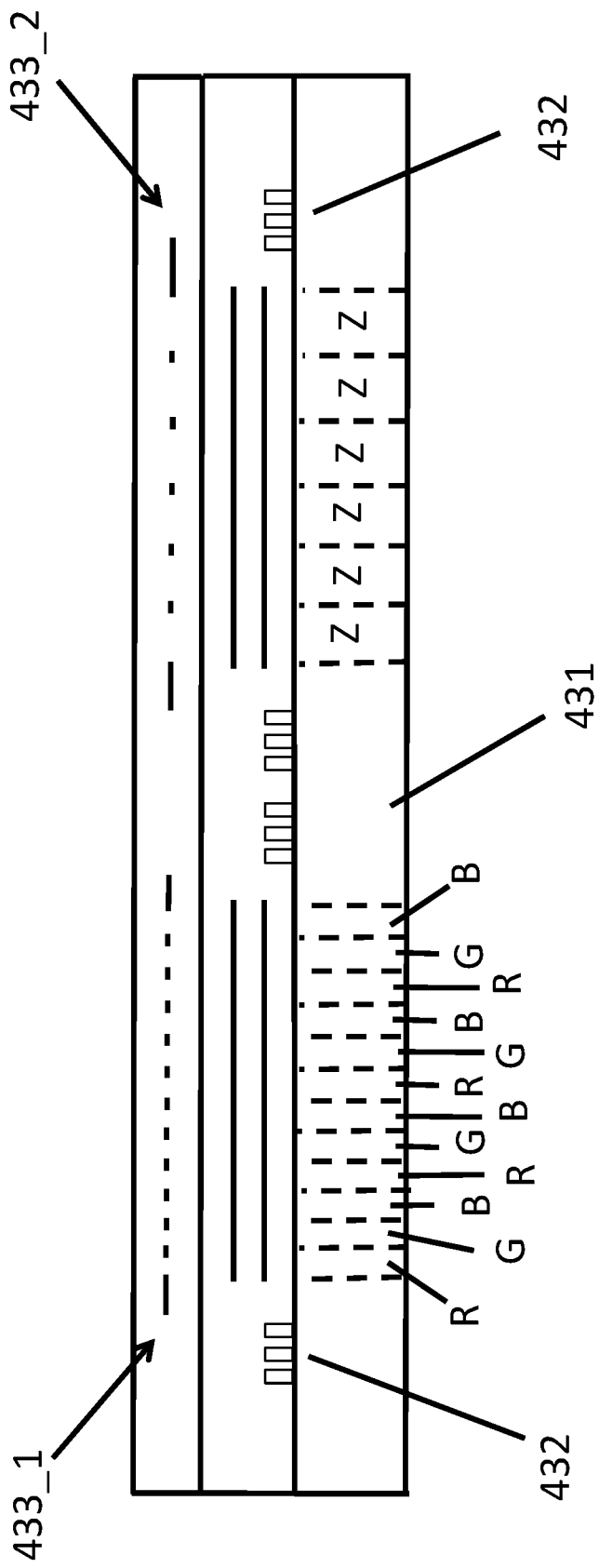

As observed in FIG. 4b, above the metallization layers there may (optionally) reside a pixelated aperture layer 433 or "light shield" to effectively pixel-ize the optical signal before it impinges upon the surface of the semiconductor substrate 431. Incident light that impinges upon the aperture layer metallization 433 is generally blocked from reaching the underling semiconductor substrate 431 surface (as such the aperture layer 433 may be made of a material that reflects incident light such as a metal). The aperture layer 433 is typically used to prevent or diminish cross-talk between pixels and/or prevent or diminish disruption of the operation of transistors or other active devices near/within a pixel owing to their sensitivity to the incident light. The aperture layer 433 may be deposited as a separate film over the interconnect metallization 430 or formed in the last layer of the interconnect metallization 430 discussed above. Again, in various embodiments the Z pixels may be larger than the RGB pixels. As such the openings of the Z pixel array aperture layer 433_2 may be larger than the openings of the RGB pixel array aperture layer 433_1.

Figure 4C:
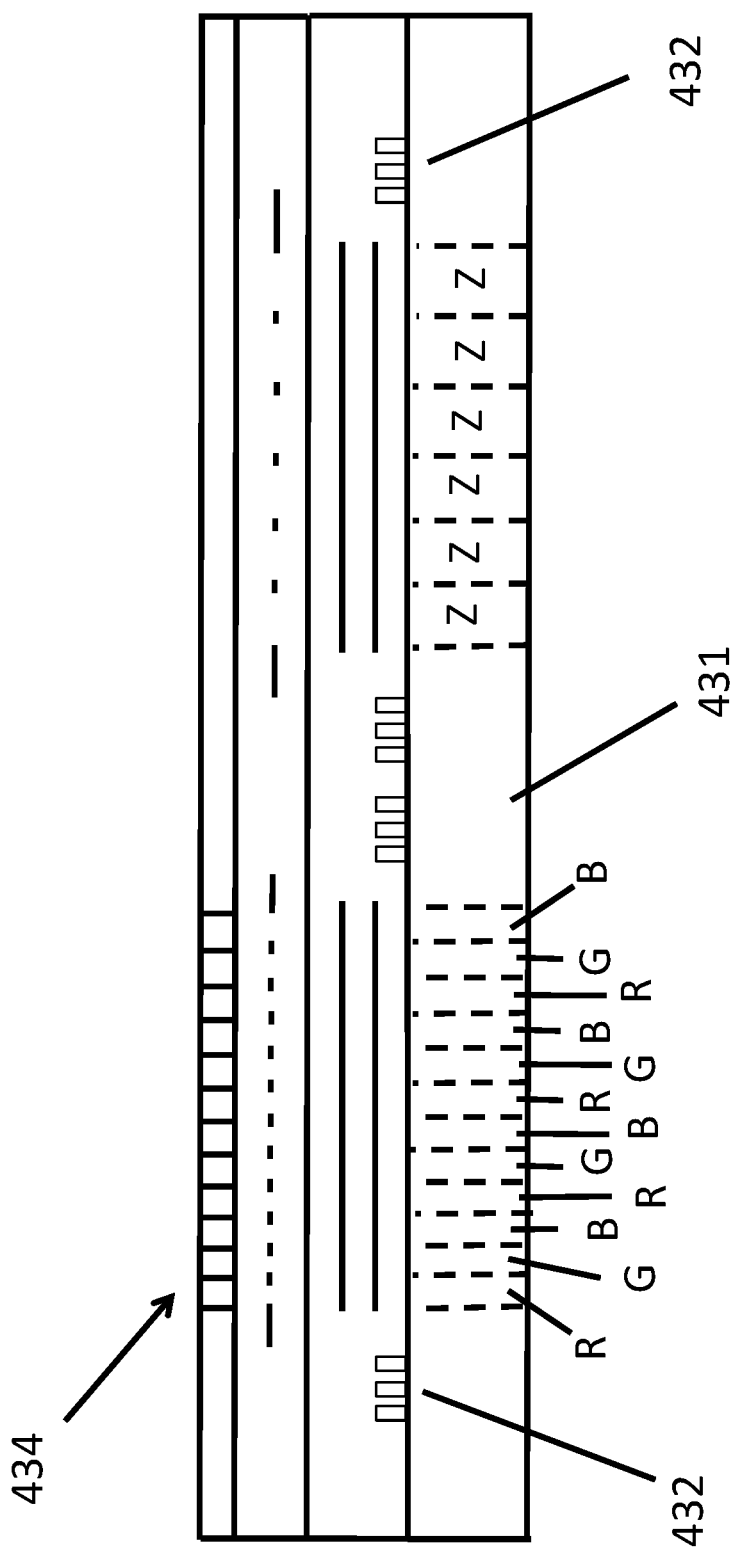

As observed in FIG. 4c, an array of colored filters 434 are formed for the RGB side of the structure. Each colored filter is vertically aligned with a specific aperture and underlying region of the semiconductor substrate 431. Each individual filter also has a specific optical passband designed to mainly pass light of a specific color (red, blue or green). Multiple sequences may be performed in order to form the RGB filters as each type of filter R, G and B will typically require at least one masking and/or dying or other sequence that is specific to its own particular color. Each type of colored filters may be formed by any of a number of processes such as: 1) coating a mordent layer on the surface of the underlying structure and then heat transferring a mordent dye through a photoresist mask and then stripping the mask; 2) coating a transparent layer on the surface of the underlying structure and then imbibing a dye through a photoresist mask and then stripping the mask; 3) coating a dyed layer on the surface of the underlying structure and then reactive ion etching (RIE) regions of the layer through a mask and then stripping the mask; 4) coating and patterning a material with a combination of dye and photoresist.

Although not depicted, an optional set of IR filters may be optionally disposed over the Z pixel side of the array. If IR filters are not included (as depicted in FIG. 4c), the Z side of the pixel array can be masked out during the processing of the RGB filter array 434.

Figure 4D:
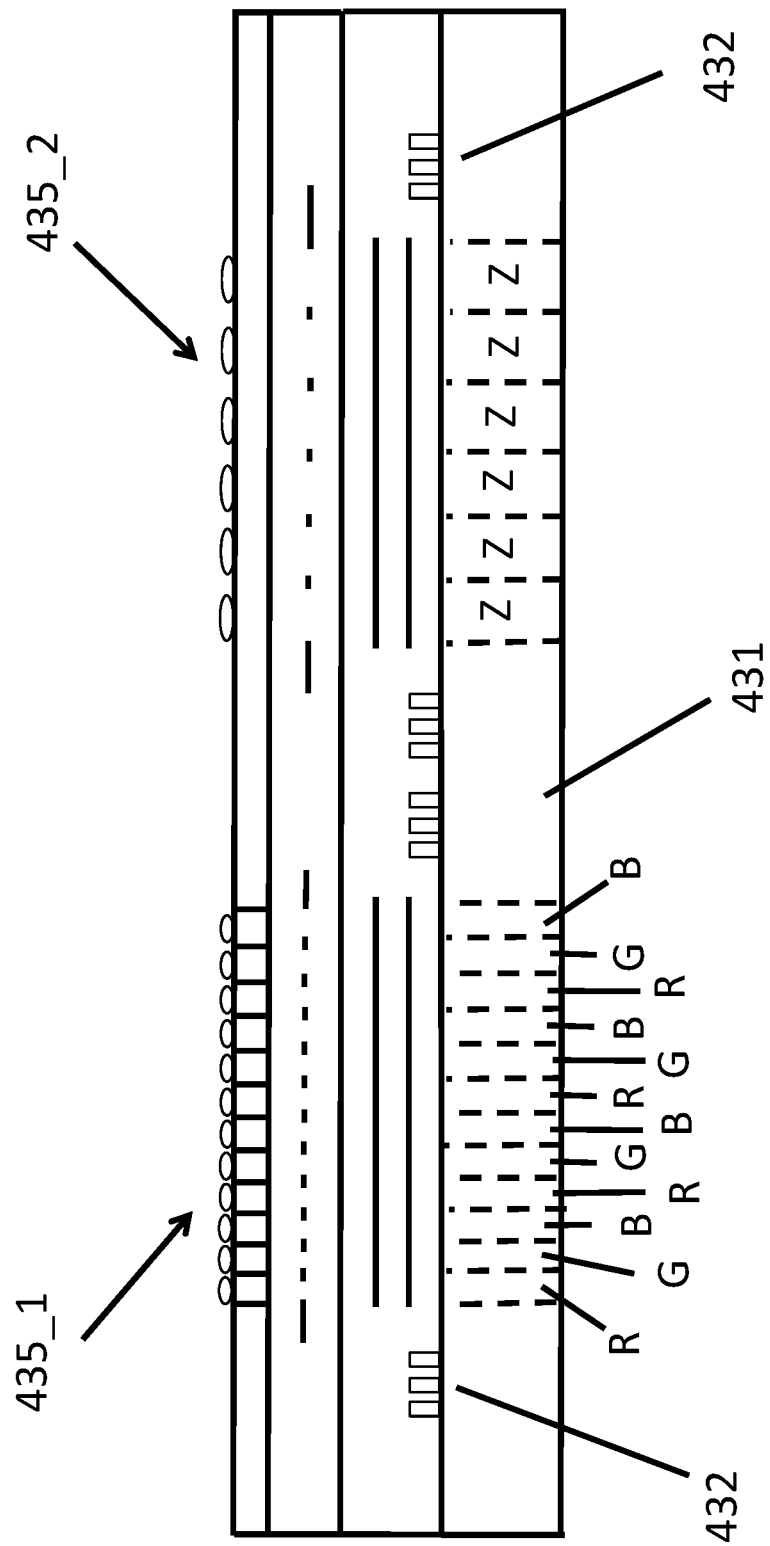

As observed in FIG. 4d, after the color filters 434 are formed on the RGB pixel array side of the structure, micro-lenses 435_1, 435_2 are formed over both the RGB array side and the Z pixel array side of the structure. Notably, because of the larger Z pixel size, the micro-lenses 435_2 on the Z pixel array side are larger than the micro-lenses 435_1 on the RGB pixel array side. Each micro-lens array 435_1, 435_2 can be formed by any of a number of various processes such as: 1) coating and baking one or more photoresist layers on the underlying structure, patterning the photoresist layers into, e.g., circles/cylinders representing the micro-lens array and then melting the photoresist circles/cylinders into the shape of the micro-lenses; 2) performing the process of 1) above on a transparent layer (e.g., fused silica) and using the melted photoresist as a mask for a reactive ion etch (RIE) etch into the transparent layer (which completes the form of fuller micro-lenses into the transparent layer); 3) micro-jetting droplets aimed on the underlying structure in the array pattern and solidifying the droplets.

Figure 5:
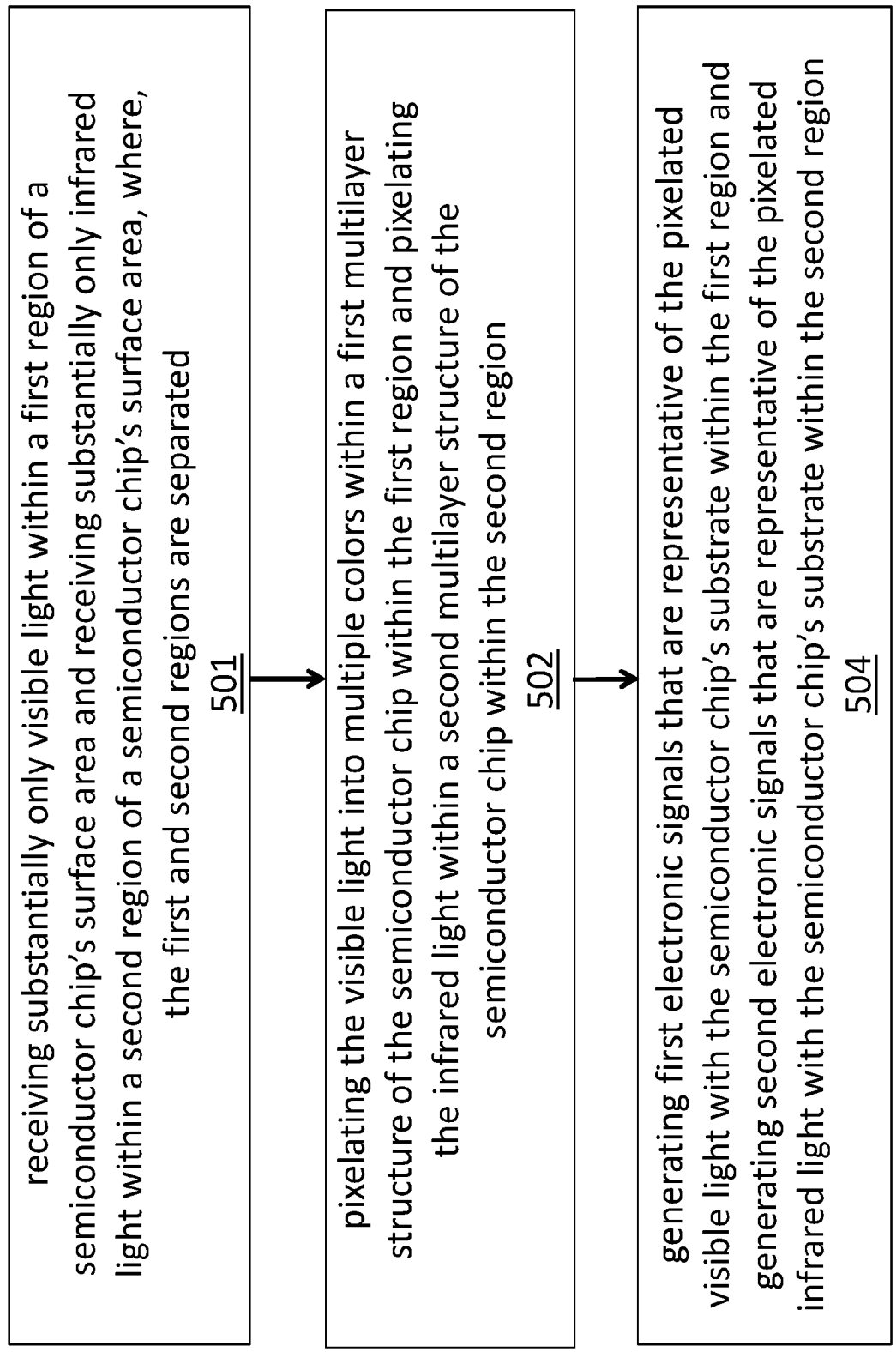
FIG. 5 shows a method performed by a monolithic RGBZ pixel array.

FIG. 5 shows a method performed by a monolithically integrated RGB pixel array and Z pixel array. As observed in FIG. 5, the method includes receiving substantially only visible light within a first region of a semiconductor chip's surface area and receiving substantially only infrared light within a second region of a semiconductor chip's surface area, where, the first and second regions are separated 501. The method also includes pixelating the visible light into multiple colors within a first multilayer structure of the semiconductor chip within the first region and pixelating the infrared light within a second multilayer structure of the semiconductor chip within the second region 502. The method also includes generating first electronic signals that are representative of the pixelated visible light with the semiconductor chip's substrate within the first region and generating second electronic signals that are representative of the pixelated infrared light with the semiconductor chip's substrate within the second region 504.

Figure 6:
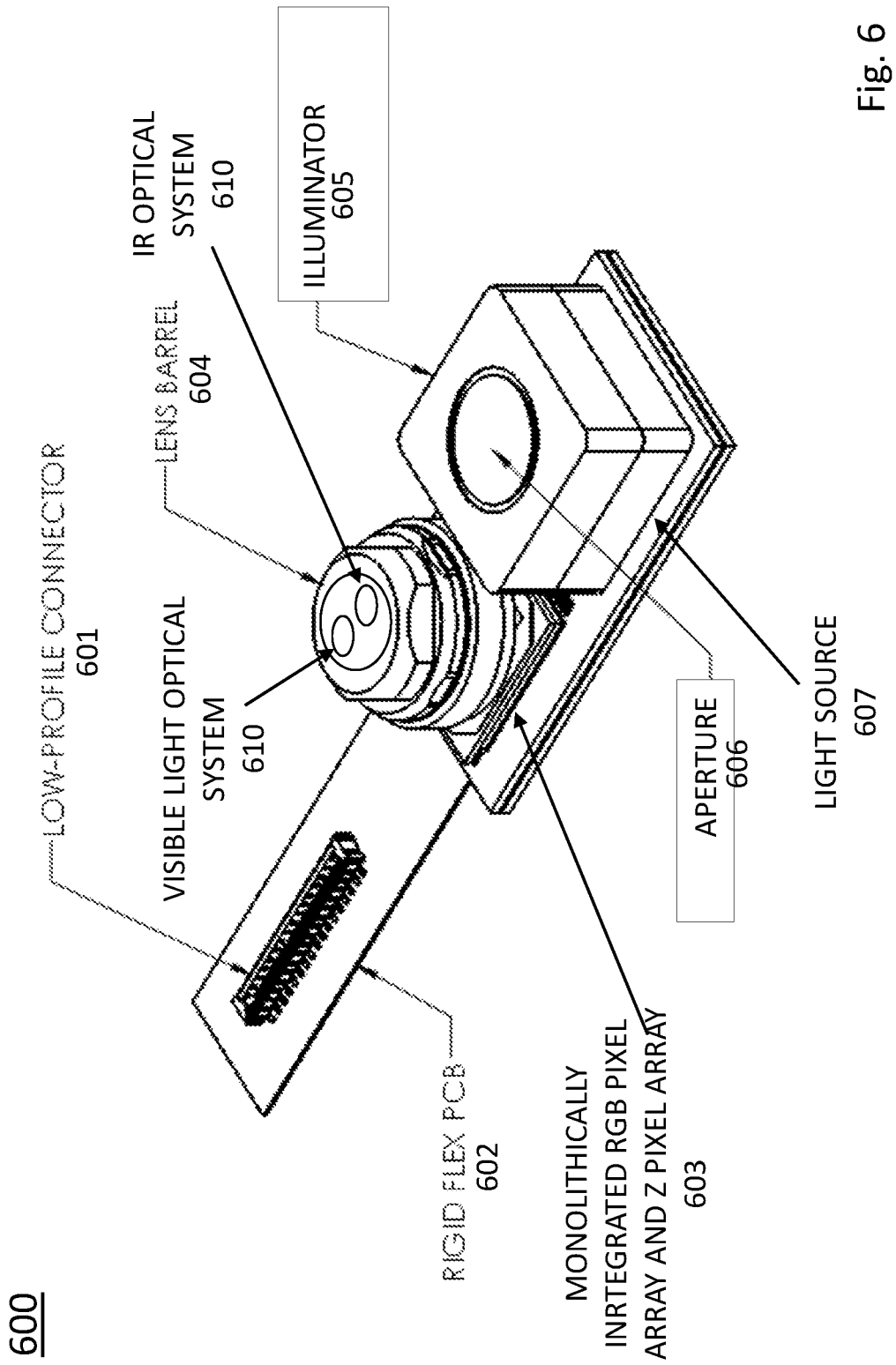
FIG. 6 shows a camera system that includes a monolithic RGBZ pixel array.

FIG. 6 shows an integrated traditional camera and time-of-flight imaging system 600. The system 600 has a connector 601 for making electrical contact, e.g., with a larger system/mother board, such as the system/mother board of a laptop computer, tablet computer or smartphone. Depending on layout and implementation, the connector 601 may connect to a flex cable that, e.g., makes actual connection to the system/mother board, or, the connector 601 may make contact to the system/mother board directly.

The connector 601 is affixed to a planar board 602 that may be implemented as a multi-layered structure of alternating conductive and insulating layers where the conductive layers are patterned to form electronic traces that support the internal electrical connections of the system 600. Through the connector 601 commands are received from the larger host system such as configuration commands that write/read configuration information to/from configuration registers within the camera system 600.

A monolithically integrated RGB pixel array and Z pixel array 603 are implemented on a semiconductor chip that sits beneath a camera lens module 604 having a visible light optical system 610 and an IR optical system 610. The monolithically integrated RGB pixel array and Z pixel array may be part of an RGBZ image sensor having ADC circuitry and timing and control circuitry for both pixel arrays that is packaged in a semiconductor chip package and mounted on planar board 602. The RGB pixels are used to support traditional "2D" visible image capture (traditional picture taking) functions. The IR sensitive Z pixels are used to support 3D depth profile imaging using time-of-flight techniques. Although a basic embodiment includes RGB pixels for the visible image capture, other embodiments may use different colored pixel schemes (e.g., Cyan, Magenta and Yellow).

The planar board 602 may likewise include signal traces to carry digital information provided by the ADC circuitry to the connector 601 for processing by a higher end component of the computing system, such as an image signal processing pipeline (e.g., that is integrated on an applications processor). Note that in other embodiments an image signal processing pipeline or at least some form of digital signal processing performed on the ADC output pixel stream may be performed with digital logic circuitry on a semiconductor chip that is integrated into the camera system 600.

An illuminator 605 composed of a light source 607 beneath an aperture 606 is also mounted on the planar board 602. The light source 607 may be implemented as an array of vertical cavity side emitting lasers (VCSELs) or light emitting diodes (LEDs) implemented on a semiconductor chip that is mounted to the planar board 601. Alternatively, a single light source may be used (e.g. a single VCSEL or LED as opposed to an array). A light source driver is coupled to the light source array to cause it to emit light with a particular intensity and modulated waveform.

In an embodiment, the integrated system 600 of FIG. 6 supports three modes of operation: 1) 2D mode; 3) 3D mode; and, 3) 2D/3D mode. In the case of 2D mode, the system behaves as a traditional camera. As such, illuminator 607 is disabled and the image sensor is used to receive visible images through its RGB pixels. In the case of 3D mode, the system is capturing time-of-flight depth information of an object in the field of view of the illuminator 607 and the camera lens module 604. As such, the illuminator is enabled and emitting IR light (e.g., in an on-off-on-off . . . sequence) onto the object. The IR light is reflected from the object, received through the camera lens module 604 and sensed by the image sensor's time-of-flight pixels. In the case of 2D/3D mode, both the 2D and 3D modes described above are concurrently active.

Figure 7:
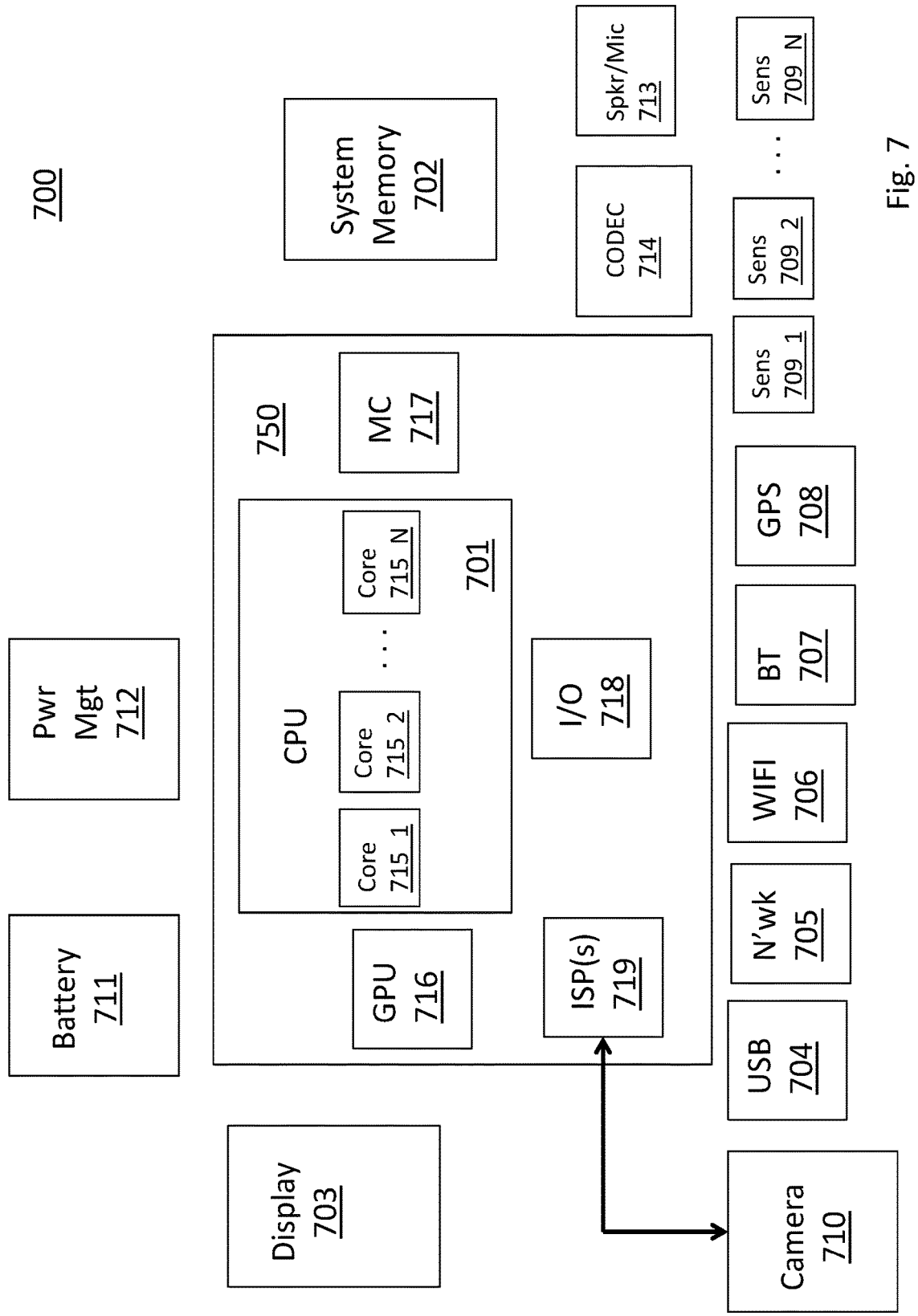
FIG. 7 shows a computing system that includes a camera having a monolithic RGBZ pixel array.

FIG. 7 shows a depiction of an exemplary computing system 700 such as a personal computing system (e.g., desktop or laptop) or a mobile or handheld computing system such as a tablet device or smartphone. As observed in FIG. 7, the basic computing system may include a central processing unit 701 (which may include, e.g., a plurality of general purpose processing cores) and a main memory controller 717 disposed on an applications processor or multi-core processor 750, system memory 702, a display 703 (e.g., touchscreen, flat-panel), a local wired point-to-point link (e.g., USB) interface 704, various network I/O functions 705 (such as an Ethernet interface and/or cellular modem subsystem), a wireless local area network (e.g., WiFi) interface 706, a wireless point-to-point link (e.g., Bluetooth) interface 707 and a Global Positioning System interface 708, various sensors 709_1 through 709_N, one or more cameras 710, a battery 711, a power management control unit 712, a speaker and microphone 713 and an audio coder/decoder 714.

An applications processor or multi-core processor 750 may include one or more general purpose processing cores 715 within its CPU 401, one or more graphical processing units 716, a main memory controller 717, an I/O control function 718 and one or more image signal processor pipelines 719. The general purpose processing cores 715 typically execute the operating system and application software of the computing system. The graphics processing units 716 typically execute graphics intensive functions to, e.g., generate graphics information that is presented on the display 703. The memory control function 717 interfaces with the system memory 702. The image signal processing pipelines 719 receive image information from the camera and process the raw image information for downstream uses. The power management control unit 712 generally controls the power consumption of the system 700.

Each of the touchscreen display 703, the communication interfaces 704-707, the GPS interface 708, the sensors 709, the camera 710, and the speaker/microphone codec 713, 714 all can be viewed as various forms of I/O (input and/or output) relative to the overall computing system including, where appropriate, an integrated peripheral device as well (e.g., the one or more cameras 710). Depending on implementation, various ones of these I/O components may be integrated on the applications processor/multi-core processor 750 or may be located off the die or outside the package of the applications processor/multi-core processor 750.

In an embodiment one or more cameras 710 includes an integrated traditional visible image capture and time-of-flight depth measurement system such as the system 600 described above with respect to FIG. 6. Application software, operating system software, device driver software and/or firmware executing on a general purpose CPU core (or other functional block having an instruction execution pipeline to execute program code) of an applications processor or other processor may direct commands to and receive image data from the camera system. In the case of commands, the commands may include entrance into or exit from any of the 2D, 3D or 2D/3D system states discussed above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A device comprising:
a visible light optical system that is configured to pass visible light and to block infrared light, and a separate, infrared light optical system that is configured to pass infrared light and block visible light,
wherein the visible light optical system includes a first set of lenses that receives light reflected off an object and passes through the visible light and the infrared light optical system includes a second, different set of lenses that receives light reflected off the object and passes through the infrared light; and
an image sensor that includes a visible light pixel array for receiving visible light that passes through the visible light optical system, and an infrared light pixel array for receiving infrared light that passes through the separate, infrared light optical system, wherein the visible light pixel array and the infrared light pixel array are both mounted on a same semiconductor chip,
wherein a distance between a center of the visible light pixel array and a center of the infrared light pixel array is less than a distance between an optical axis of the first set of lenses of the visible light optical system and an optical axis associated with the second set of lenses of the infrared light optical system.

2. The device of claim 1, comprising a first system of mirrors that is configured to steer visible light that is output by the visible light optical system after the infrared light is blocked by the visible light optical system towards the visible light pixel array, and a second system of mirrors that is configured to steer infrared light that is output from the infrared light optical system after the visible light is blocked by the infrared light optical system towards the infrared light pixel array.

3. The device of claim 1, comprising, for each of the visible light pixel array and the infrared light pixel array, (i) timing and control circuitry for the pixel array, (ii) analog-to-digital circuitry for the pixel array, and (iii) timing and control circuitry for the pixel array, all mounted on the same semiconductor chip.

4. The device of claim 1, comprising:
for each of the visible light pixel array and the infrared light pixel array, timing and control circuitry for the pixel array, mounted on the same semiconductor chip, and
wherein, for each of the visible light pixel array and the infrared light pixel array, (i) analog-to-digital circuitry for the pixel array, and (ii) timing and control circuitry for the pixel array are not mounted on the same semiconductor chip.

5. The device of claim 1, wherein the infrared light pixel array is for capturing a pixelated depth profile of an object.

6. The device of claim 1, wherein the visible light pixel array and the infrared light pixel array do not overlap on the semiconductor chip.

7. The device of claim 1, wherein the semiconductor chip is mounted on a second semiconductor chip.

8. The device of claim 1, wherein pixels of the infrared light pixel array are smaller than pixels of the visible light pixel array.

9. The device of claim 1, wherein the infrared light pixel array and the visible light pixel array are the same size.

10. A system comprising:
a camera comprising:
a visible light optical system that is configured to pass visible light and to block infrared light, and a separate, infrared light optical system that is configured to pass infrared light and block visible light,
wherein the visible light optical system includes a first set of lenses that receives light reflected off an object and passes through the visible light and the infrared light optical system includes a second, different set of lenses that receives light reflected off the object and passes through the infrared light; and
an image sensor that includes a visible light pixel array for receiving visible light that passes through the visible light optical system, and an infrared light pixel array for receiving infrared light that passes through the separate, infrared light optical system, wherein the visible light pixel array and the infrared light pixel array are both mounted on a same semiconductor chip,
wherein a distance between a center of the visible light pixel array and a center of the infrared light pixel array is less than a distance between an optical axis of the first set of lenses of the visible light optical system and an optical axis associated with the second set of lenses of the infrared light optical system; and
one or more computer processors that are configured to receive signals output by the image sensor, and to generate a pixelated depth profile of an object position in front of the camera.

11. The system of claim 10, wherein the camera comprises a first system of mirrors that is configured to steer visible light that is output by the visible light optical system after the infrared light is blocked by the visible light optical system towards the visible light pixel array, and a second system of mirrors that is configured to steer infrared light that is output from the infrared light optical system after the visible light is blocked by the infrared light optical system towards the infrared light pixel array.

12. The system of claim 10, wherein the camera comprises, for each of the visible light pixel array and the infrared light pixel array, (i) timing and control circuitry for the pixel array, (ii) analog-to-digital circuitry for the pixel array, and (iii) timing and control circuitry for the pixel array, all mounted on the same semiconductor chip.

13. The system of claim 10, wherein the camera comprises:
for each of the visible light pixel array and the infrared light pixel array, timing and control circuitry for the pixel array, mounted on the same semiconductor chip, and
wherein, for each of the visible light pixel array and the infrared light pixel array, (i) analog-to-digital circuitry for the pixel array, and (ii) timing and control circuitry for the pixel array are not mounted on the same semiconductor chip.

14. The system of claim 10, wherein the visible light pixel array and the infrared light pixel array do not overlap on the semiconductor chip.

15. The system of claim 10, wherein the semiconductor chip is mounted on a second semiconductor chip.

16. The system of claim 10, wherein pixels of the infrared light pixel array are smaller than pixels of the visible light pixel array.

17. The system of claim 10, wherein the infrared light pixel array and the visible light pixel array are the same size.

18. A method comprising:
passing visible light through a visible light optical system that is configured block infrared light;
passing infrared light through a separate, infrared light optical system that is configured to block visible light,
wherein the visible light optical system includes a first set of lenses that receives light reflected off an object and passes through the visible light and the infrared light optical system includes a second, different set of lenses that receives light reflected off the object and passes through the infrared light; and
receiving, by an image sensor, the visible light at a visible light pixel array for receiving visible light that passes through the visible light optical system, and an infrared light pixel array for receiving infrared light that passes through the separate, infrared light optical system, wherein the visible light pixel array and the infrared light pixel array are both mounted on a same semiconductor chip,
wherein a distance between a center of the visible light pixel array and a center of the infrared light pixel array is less than a distance between an optical axis of the first set of lenses of the visible light optical system and an optical axis associated with the second set of lenses of the infrared light optical system.

19. The device of claim 1, wherein the first set of lenses includes a plano-concave lens, a plano convex lens, and a convex lens.

20. The device of claim 2, wherein the first system of mirrors that is configured to steer visible light includes two mirrors off which the visible light reflects.

* * * * *